(12) United States Patent
Chan et al.

(10) Patent No.: US 7,452,747 B2
(45) Date of Patent: Nov. 18, 2008

(54) SEMICONDUCTOR PACKAGE WITH CONTACT SUPPORT LAYER AND METHOD TO PRODUCE THE PACKAGE

(75) Inventors: Kai Chong Chan, Singapore (SG); Charles Wee Ming Lee, Singapore (SG); Gerald Ofner, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 11/501,913

(22) Filed: Aug. 10, 2006

(65) Prior Publication Data
US 2007/0037319 A1 Feb. 15, 2007

Related U.S. Application Data

(63) Continuation of application No. PCT/IB2004/000345, filed on Feb. 11, 2004.

(51) Int. Cl.
*H01L 21/44* (2006.01)
(52) U.S. Cl. .............. 438/106; 438/108; 438/110; 438/114; 438/613; 257/E21.508
(58) Field of Classification Search .......... 438/106, 438/108, 110, 114, 613; 257/E21.508
See application file for complete search history.

(56) References Cited

U.S. PATENT DOCUMENTS

| 5,909,634 | A | * | 6/1999 | Hotchkiss et al. ........... 438/612 |
| 5,953,623 | A | * | 9/1999 | Boyko et al. ................ 438/612 |
| 6,060,373 | A | | 5/2000 | Saitoh |
| 6,064,114 | A | | 5/2000 | Higgins, III |
| 6,338,980 | B1 | | 1/2002 | Satoh |
| 6,475,896 | B1 | | 11/2002 | Hashimoto |
| 6,566,762 | B1 | | 5/2003 | Baker et al. |
| 2002/0095783 | A1 | | 7/2002 | Kirsten |
| 2005/0133933 | A1 | * | 6/2005 | Shen et al. ................... 257/779 |

FOREIGN PATENT DOCUMENTS

| DE | 10133791 A1 | 2/2003 |
| JP | 10190196 | 7/1998 |

* cited by examiner

*Primary Examiner*—Andy Huynh
(74) *Attorney, Agent, or Firm*—Edell, Shapiro & Finnan, LLC

(57) ABSTRACT

A semiconductor package comprises a substrate which includes a plurality of conducting traces and upper contact areas on its upper surface and a second plurality of lower conductive traces and external contact areas on its bottom surface and external conducting members attached to the external contact areas. The semiconductor package also includes a semiconductor die comprising an active surface with a plurality of die contact pads, electrically connected to the contact areas of the substrate by conducting members. A support layer between the conducting members on the active surface of the semiconductor die covers at least the base portion of the conducting members. A method relates to the production of the semiconductor package.

8 Claims, 3 Drawing Sheets

SEMICONDUCTOR PACKAGE WITH CONTACT SUPPORT LAYER AND METHOD TO PRODUCE THE PACKAGE

CROSS REFERENCE TO RELATED APPLICATIONS

This application is a continuation of International Application No. PCT/IB2004/000345, filed on Feb. 11, 2004, and entitled "Semiconductor Package with Contact Support Layer and Method to Produce the Package," the entire contents of which are hereby incorporated by reference.

FIELD OF THE INVENTION

The invention relates to a method of producing a semiconductor package including a contact support layer.

BACKGROUND

German Patent Publication No. DE 101 33 791 A1 describes a method for positioning and attaching pre-formed solder balls to a semiconductor chip. However, this method is complicated and unreliable.

SUMMARY

The invention relates to a simple cost-effective method of producing a more reliable semiconductor package.

A method to assemble a semiconductor package including a contact support layer according to the invention comprises providing a semiconductor wafer which includes a plurality of semiconductor dies or chips. Each semiconductor die comprises an active surface with a plurality of die contact areas or pads. Precursor conducting members or precursor bumps are formed or deposited on the die contact areas. The precursor conducting members preferably comprise a solder-based material such as a high lead, eutectic solder or a lead free solder.

The front surface of the wafer, which includes the active surface of the dies, and at least the base of the precursor conducting members are coated with an electrically insulating or contact support layer. The thickness of the support layer is preferably in the range of approximately 0.1 µm to approximately 110 µm. The wafer is subsequently heated to form conducting members such as solder bumps or microscopic solder balls from the precursor conducting members. A tape or tape laminate, preferably a UV tape thereby residues are reduced, is subsequently attached to the upper surface of the conducting members and to the upper surface of the electrically insulating layer to provide further protection of the conducting members. The back surface of the wafer is subsequently thinned until the wafer has the desired thickness and/or surface finish. The wafer typically has a thickness of approximately 750 µm before the thinning process and a thickness of less than approximately 250 µm after the thinning process. The tape is subsequently removed and the individual dies are separated from the wafer.

The electrically insulating or support layer according to the invention is extremely advantageous. It is deposited on the front surface of the wafer before the precursor conducting members are heated in a solder reflow process. Thereby, the precursor conducting members, which preferably comprise a solder material, are prevented from laterally spreading and are mechanically restricted to the die contact areas therefore preventing short circuits between the circuits on the active surface of the die.

During the solder reflow the upper portions of the conducting members become rounded due to the effect of surface tension. The rounded shape is desired and advantageous. Additionally, the electrically insulating layer advantageously acts as a mechanical support or collar for the conducting members during the wafer thinning or back-grinding process as it is in close contact with the base of the conducting members and the interface between the conducting members and the die contact pads.

The electrically insulating layer has a further advantage in that during the tape lamination stage, the tape fits well on the conducting members and air entrapment at the base of the conducting members is avoided. Consequently, a more reliable support is provided for the conducting members during the thinning process and moreover, the contacts do not become damaged during the thinning process. Therefore, the reliability of packages fabricated using the method of the invention is improved.

The electrically insulating layer preferably comprises a transparent or translucent material and has a thickness so that the saw streets between the individual dies which are included in the front side of the wafer remain visible after the coating is deposited on the wafer. This is advantageous as the saw streets can then be used to accurately separate the individual dies or chips from the wafer.

The electrically insulating layer also acts as an interfacial enhancer between the passivation layer on the active surface of the chip and the underfill material. A more efficient and reliable underfilling of the chips is achieved using the method according to the invention. The reliability of the package is also improved.

Packages including the electrically insulating layer are also less likely to become damaged during the subsequent processing and testing stage of the manufacturing process since the electrically insulating layer provides additional mechanical support to the conducting members. Fewer packages are therefore discarded, improving the production rate of the manufacturing process.

Advantageously, the precursor conducting members are formed or deposited on the die contact areas at the wafer-level and more advantageously by an electro-plating technique. The formation of the precursor conducting members at the wafer-level is more efficient and cost-effective. The use of an electroplating technique is efficient since all of the precursor conducting members are formed in one manufacturing step and essentially simultaneously. This reduces manufacturing time and simplifies the process. Electro-plating also improves the accuracy of the positioning of the conducting members on the die contact pads and the uniformity of the conducting members.

Alternatively, the precursor conducting members are formed on the die contact areas by a screen-printing technique which is advantageously used to deposit the precursor conducting members at the wafer level. Thereby, manufacturing time is reduced and the process simplified.

Precursor conducting members deposited by electro-plating typically have a mushroom-type shape where the top portion of the bump has a rounded form and is laterally larger than the bottom portion which is essentially rod-shaped. The insulating support layer advantageously supports the base of the precursor bump and improves the reliability of the contact.

Preferably, the electrically insulating layer is deposited on the front surface of the wafer by a spin-coating technique. This has the advantage that the layer can be simply and quickly deposited and its thickness controlled as desired. A coating with a homogeneous thickness and good coverage is advantageously obtained using a spin-coating technique.

Alternatively, the electrically insulating layer is deposited by a dip-coating technique. Dip-coating has the advantage that the thickness of the coating over the surfaces of the conducting bumps can be controlled. The coating is, for example, thicker at the base and thinner towards the top if desired. An essentially discrete collar of epoxy flux is formed around the base portion of each conducting bump. This has the advantage that additional mechanical support is provided at the base of the bump and the quantity of epoxy flux material used in the process is reduced. Alternatively, an essentially continuous layer of epoxy flux can be formed on the upper surface of the wafer. The electrically insulating layer preferably comprises epoxy flux or epoxy flux underfill material.

The thinning of the back side of the wafer or back-grinding of the wafer is performed by mechanical grinding and polishing or chemical etching or a method known in the art.

The method of the invention is advantageously used for flip-chip or ball grid array packages or chip-sized packages or ultra thin ball grid array packages or wafer level chip-sized packages or over-molded flip-chip packages.

After the dies are separated from the wafer, they are assembled to form a semiconductor package. The dies are mounted on a substrate such as a redistribution board so that the active surface of the die faces the upper surface of the redistribution board and the conducting members provide the electrical connection between the chip or die and the redistribution board. External contacts or conducting members such as solder balls are attached to the bottom surface of the redistribution board to provide the electrical connection from the package to an external substrate such as a printed circuit board.

A semiconductor package assembled according to the invention includes a substrate, such as a redistribution board, which comprises a plurality of upper conducting traces and upper contact areas on its upper surface and a second plurality of conductive traces and external contact areas on its bottom surface. External conducting members such as solder balls are attached to the external contact areas on the bottom of the substrate.

The semiconductor package also includes a semiconductor die or chip which comprises an active surface with a plurality of die contact areas or pads. Conducting members such as microscopic solder balls provide the electrical connection between the die contact areas and upper contact areas of the substrate. The area between the active surface of the die and the upper surface of the substrate is underfilled by, for example, epoxy resin or epoxy flux underfill. The semiconductor package of the invention also includes an electrically insulating or support layer between the conducting members on the active surface of the die which covers at least the base portion of the conducting members. The electrically insulting layer comprises, for example, an epoxy flux or epoxy flux underfill material. The electrically insulating support layer can be seen in a polished cross-section of the semiconductor package according to the invention with the aid of a microscope.

The contact support layer according to the invention provides an improved degree of support to bumps during the backgrinding of the bumped wafer. Unlike the use of wax, the deposition of the epoxy support layer is simple and flexible and a lengthy removal process is not required. A good contact is obtained between the tape and the bumps as the base of the bump is already supported by the epoxy. This ensures that the UV tape is fully cured and reduces residue formation at the circumference of the bump. The method of the invention is also very simple and quick in comparison to the use of resists to support the bumps. In particular, the strip of the resists is difficult and time-consuming.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to exemplary embodiments, where.

DETAILED DESCRIPTION

Figure 1:
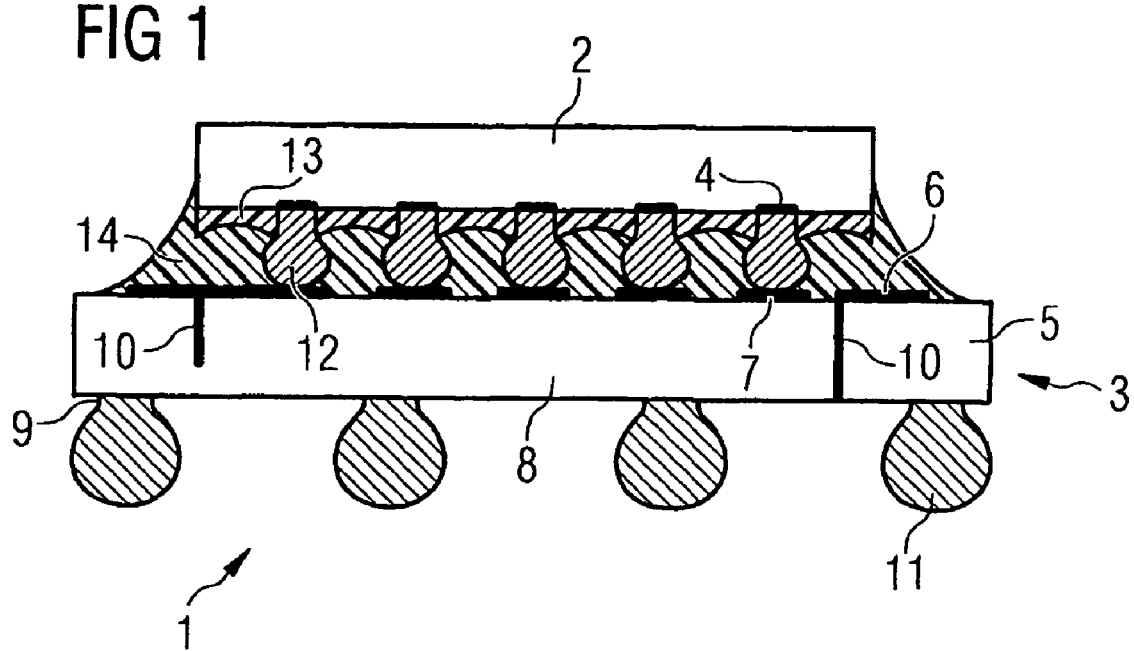
FIG. 1 shows a cross-sectional view of a Ball-Grid-Array semiconductor package assembled according to the invention.

FIG. 1 shows a cross-sectional view of a semiconductor package 1 including a semiconductor die 2 which is mounted by the flip-chip technique to a redistribution board 3.

The semiconductor die 2 comprises an active surface including a plurality of die contact pads 4 and a passive surface. The redistribution board 3 comprises a sheet of non-conducting core material 5 and includes a plurality of upper conducting traces 6 and upper contact pads 7 on its upper surface and a second plurality of lower conductive traces 8 and external contact areas 9 on its bottom surface. The redistribution board 3 also includes a plurality of essentially vertical electrically conducting vias 10 which electrically connect the upper contact pads 7 with contact areas 9 on the bottom surface of the redistribution board 3. Solder balls 11 are attached to the external contact areas 9 to provide the electrical connection from the package 1 to an external circuit board (which is not shown in the Figure).

The semiconductor die 2 is mounted with its active surface facing the upper surface of the redistribution board 3 and it is electrically connected to the redistribution board 3 by microscopic solder balls 12 positioned between the die contact areas 4 and the upper contact pads 7 on the upper surface of the redistribution board 3. The term microscopic is used here to describe solder balls that are seen with the aid of a microscope.

A thin support layer of epoxy 13 coats the active surface of the die 2 between the microscopic solder balls 12. The area between the thin support epoxy layer 13 and the upper surface of the redistribution board 3 is filled by underfill material 14. The interface between the thin epoxy layer 13 and the underfill material 14 can be observed in a polished cross-section with the aid of a microscope.

Figure 2:
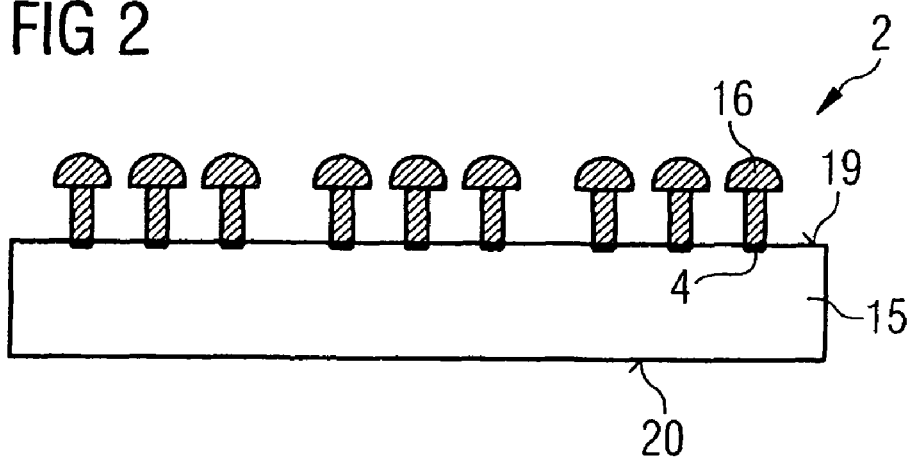
FIG. 2 shows a wafer including a plurality of semiconductor dies each including a plurality of electro-plated bumps used in the method according to the invention.

FIG. 2 shows a semiconductor wafer 15 which includes a plurality of dies 2 used in the method according to the invention. Each die 2 includes a plurality of die contact pads 4 on its active surface. The front side 19 of the wafer 15 includes the active surfaces of the dies 2. In the first step of the method according to the invention, a plurality of precursor conducting bumps 16 are deposited by a known electro-plating method on the die contact pads 4. The precursor conducting bumps 16 comprise solder. The as-deposited precursor bumps 16 have a mushroom shape which is characteristic of this process. The upper portion of the bump 16 is rounded and is laterally larger than the lower portion which has an essentially rod shape.

Figure 3:
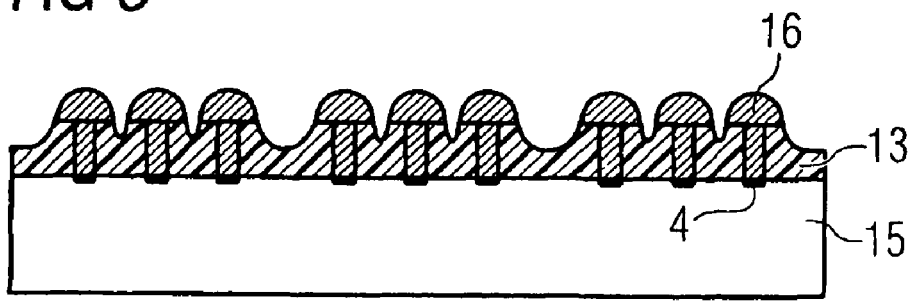
FIG. 3 shows the spin-coating of the wafer of FIG. 2 with an electrically insulating layer.

FIG. 3 shows the deposition of a thin electrically insulating layer or coating of epoxy 13 on the front side 19 of the wafer 15 by a spin-coating technique. The epoxy layer 13 has a thickness so that the lower portion of the electroplated bumps 16, which are attached to the die contact pads 4 included in the front surface 19 of the wafer 15 are coated with the epoxy layer 13. The upper surface of the epoxy layer 13 is essentially of a concave form between the solder bumps 12. The epoxy layer 13 is a contact support layer.

Figure 4:
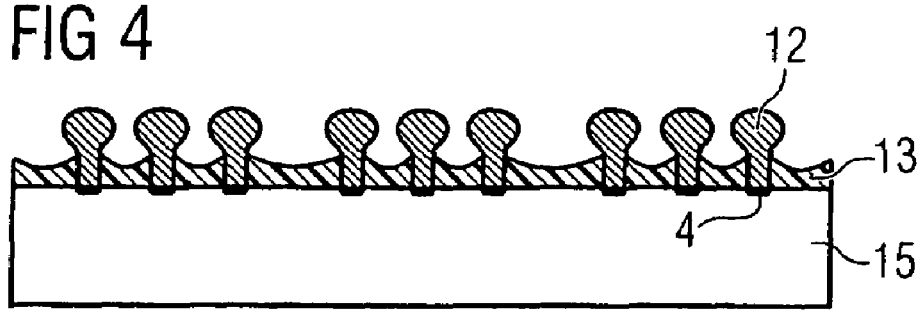
FIG. 4 shows the reflow of the electro-plated bumps of the wafer of FIG. 3.

FIG. 4 shows the next stage of the process in which the wafer 15 of FIG. 3 undergoes a solder reflow process. In this step of the process the upper portion of the electroplated precursor bumps 16 become rounded during the heat treatment forming microscopic solder balls 12. The epoxy layer 13 prevents the precursor bumps 16 from spreading laterally outwards from the die contact pads 4 into the adjacent area. The upper surface of the epoxy layer 13 has an essentially concave form between the solder balls 12.

Figure 5:
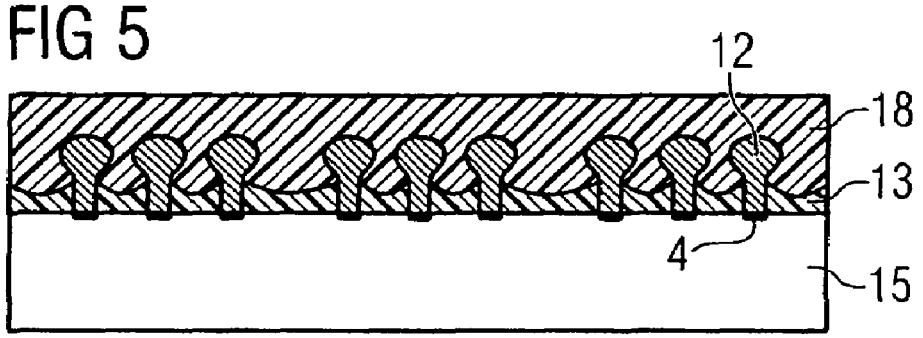
FIG. 5 shows the attachment of UV tape to the wafer of FIG. 4.

FIG. 5 shows the attachment of a UV tape laminate 18 to the front side 19 of the wafer 15 of FIG. 4. As the base portion of the solder balls 12 is supported by the epoxy layer 13, the tape laminate 18 fits closely over the surface of the solder balls 12 which is exposed above the epoxy layer 13 and the upper surface of the epoxy layer 13 which is positioned between the solder balls 12.

Figure 6:
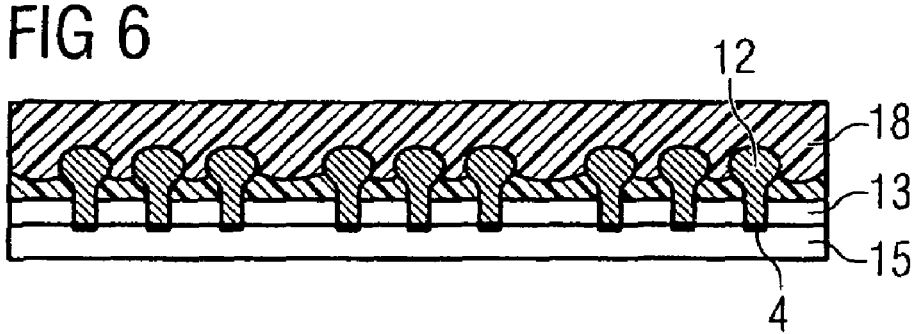
FIG. 6 shows the back-grinding of the wafer of FIG. 5.
Figure 7:
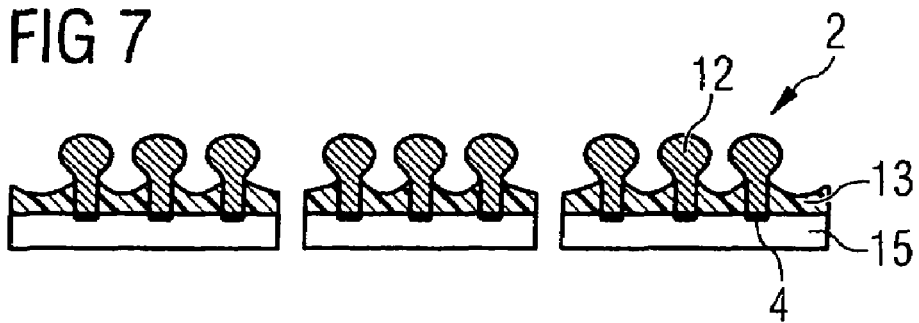
FIG. 7 shows the de-taping and singulation of semiconductor dies from the wafer of FIG. 6.

FIG. 6 shows the grinding and polishing of the back side 20 of the wafer 15 of FIG. 5 to reduce the thickness of the wafer 15. The thickness of the wafer 15 is typically reduced from approximately 750 μm to less than approximately 250 μm. FIG. 7 shows the removal of the tape 18 and singulation of the individual dies 2 from the wafer 15.

Figure 8:
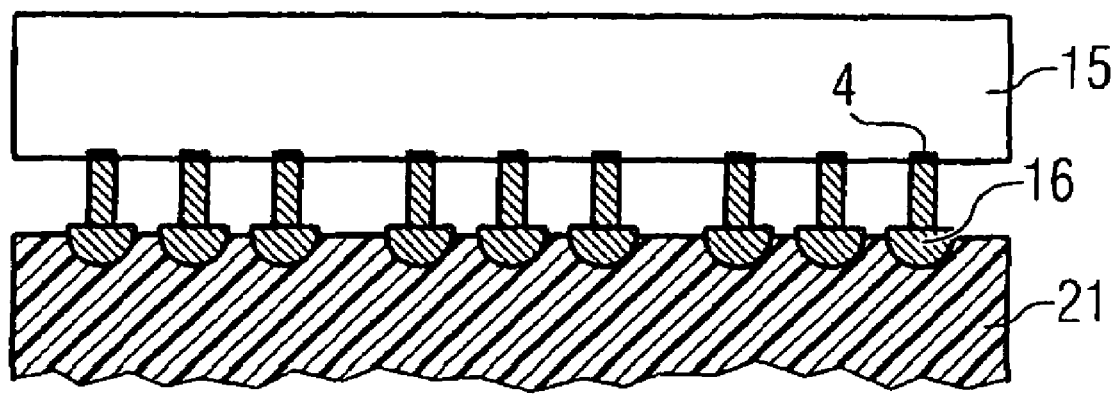
FIG. 8 shows the method step of FIG. 3 for an alternative embodiment of the invention in which the electrically insulating coating is deposited by dip-coating.

FIG. 8 shows an alternative method for coating the front side 19 of the wafer 15 with an epoxy support layer 17. In this embodiment of the invention, the front side 19 of the wafer 15 including the electroplated precursor bumps 16 is dipped into a bath 21 comprising epoxy flux resin. The electro-plated precursor bumps 16 and the front surface 19 of the wafer 15 is covered with an electrically insulating support layer 17.

Figure 9:
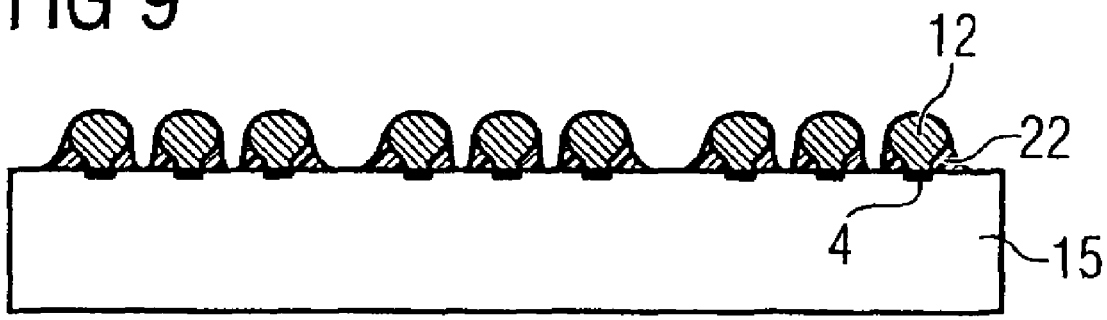
FIG. 9 shows the method step of FIG. 4 for the embodiment of FIG. 8.

FIG. 9 shows the wafer 15 after the solder reflow of the electroplated bumps 16 bumps to form microscopic solder balls 12 according to the second embodiment of the method of the invention. The volume of epoxy flux used in the dip-coating process was smaller such that a collar 22 of epoxy flux is formed around the base of each solder ball 12. The epoxy collars 22 form essentially discrete support areas around each solder ball 12.

Figure 10:
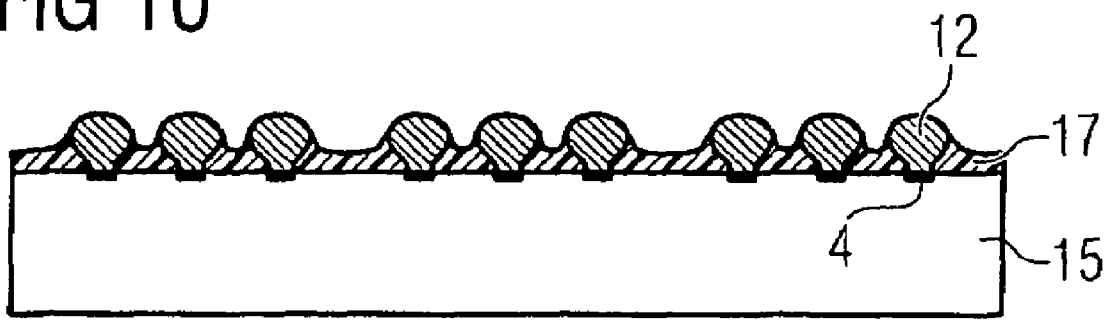
FIG. 10 shows the method step of FIG. 4 for an alternative embodiment of FIG. 8.

FIG. 10 shows an alternative epoxy support layer formed by a dip-coating method in which a larger volume of epoxy flux is used. In this embodiment of the invention, the epoxy support layer 17 forms an essentially continuous layer between the solder balls 12 and has an undulating surface which is of an essentially concave form between the solder balls 12. The thickness of the coating of each solder ball 12 is greater at the base of the solder ball 12 which is attached to the die contact pad 4 than at the top.

The wafer 15 according to the embodiments shown in FIGS. 9 and 10 is thinned using a similar process previously described. A tape 18 is then attached to the epoxy support layer 17 and the back side 20 of the wafer 15 ground and polished. The thickness of the wafer 15 is typically reduced from approximately 750 μm to less than approximately 250 μm. The individual dies are then separated from the wafer.

The dies 2 are then mounted on a redistribution board 3 to form semiconductor package 1, tested, packaged and transported to the customer.

While the invention has been described in detail and with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SIGNS 1 semiconductor package
2 semiconductor die
3 redistribution board
4 die contact areas
5 core material
6 upper conductive trace
7 upper contact pad
8 lower conductive trace
9 external contact area
10 via
11 external solder ball
12 microscopic solder ball
13 epoxy electrically insulating layer
14 underfill
15 wafer
16 electroplated precursor bump
17 dipped electrically insulating layer
18 UV tape laminate
19 front surface of wafer
20 back surface of wafer
21 epoxy flux bath
22 epoxy flux collar

What is claimed is:

1. A method for assembling a semiconductor package comprising:
   providing a wafer including a front surface and an opposing back surface, and a plurality of semiconductor dies disposed on the front surface of the wafer, wherein each semiconductor die includes an active surface with a plurality of die contact areas;
   forming mushroom-shaped precursor conducting members on the die contact areas via an electro-plating technique, the mushroom-shaped precursor conducting members having a substantially rod-shaped lower portion and a rounded upper portion that is laterally larger than the lower portion;
   coating the front surface of the wafer and at least a base portion of each of the precursor conducting members with an electrically insulating layer;

heating the wafer to form conducting members from the precursor conducting members;

attaching a tape to upper surfaces of the conducting members and to an upper surface of the electrically insulating layer;

thinning the back surface of the wafer;

removing the tape; and separating individual semiconductor dies from the wafer.

2. The method of claim 1, wherein the electrically insulating layer is deposited on the front surface of the wafer via a spin-coating technique.

3. The method according to claim 1, wherein the electrically insulating layer is deposited on the front surface of the wafer via a dip-coating technique.

4. The method according to claim 1, wherein the electrically insulating layer is deposited on the front surface of the wafer via a spin-coating technique.

5. The method of claim 1, wherein the conducting members are formed as solder balls from the precursor members by the heating of the wafer.

6. A method for assembling a semiconductor package, the method comprising:

providing a wafer including a front surface and an opposing back surface, and a plurality of semiconductor dies disposed on the front surface of the wafer, wherein each semiconductor die includes an active surface with a plurality of die contact areas:

forming precursor conducting members on the die contact areas via a screen printing technique;

coating the front surface of the wafer and at least a base portion of each of the precursor conducting members with an electrically insulating layer;

heating the wafer to form conducting members from the precursor conducting members;

attaching a tape to upper surfaces of the conducting members and to an upper surface of the electrically insulating layer;

thinning the back surface of the wafer;

removing the tape; and separating individual semiconductor dies from the wafer.

7. The method according to claim 6, wherein the electrically insulating layer is deposited on the front surface of the wafer via a spin-coating technique.

8. The method according to claim 6, wherein the electrically insulating layer is deposited on the front surface of the wafer via a dip-coating technique.

* * * * *

UNITED STATES PATENT AND TRADEMARK OFFICE
CERTIFICATE OF CORRECTION

PATENT NO. : 7,452,747 B2  Page 1 of 1
APPLICATION NO. : 11/501913
DATED : November 18, 2008
INVENTOR(S) : Chan et al.

It is certified that error appears in the above-identified patent and that said Letters Patent is hereby corrected as shown below:

Column 1, line 45: replace ""110 μm" with -- 10 μm --.

Signed and Sealed this

Seventh Day of April, 2009

JOHN DOLL
*Acting Director of the United States Patent and Trademark Office*